United States Patent [19]

Huntley

[11] Patent Number: 4,481,490
[45] Date of Patent: Nov. 6, 1984

[54] MODULATOR UTILIZING HIGH AND LOW FREQUENCY CARRIERS

[75] Inventor: Christopher R. Huntley, Burnaby, Canada

[73] Assignee: AEL Microtel, Ltd., Burnaby, Canada

[21] Appl. No.: 385,995

[22] Filed: Jun. 7, 1982

[51] Int. Cl.³ .............................................. H03C 1/54
[52] U.S. Cl. ................................... 332/41; 332/16 T; 332/22; 455/102
[58] Field of Search .................. 332/16, 16 T, 22, 41; 455/59, 102, 110; 375/52, 55, 67

[56] References Cited

U.S. PATENT DOCUMENTS 3,118,117 1/1964 King et al. ...................... 455/102 X Primary Examiner—Eugene R. Laroche
Assistant Examiner—Robert J. Pascal
Attorney, Agent, or Firm—Leonard R. Cool

[57] ABSTRACT

To minimize carrier leak in the modulation of voice frequencies to the desired line frequency for a carrier system, a first balanced modulator is operated at a low frequency where low carrier-leak modulators may be constructed and a second balanced modulator, directly coupled to the first, is employed. The modulation frequency of said second modulator is very high compared to that of said low-frequency modulator. The sideband obtained from the second modulation stage is remote from said high-frequency carrier and a band-pass filter selects the desired sideband and substantially eliminates the high-frequency carrier and the other sideband. Thus, only a low amplitude of carrier leak is present which may cause interference with other channels.

5 Claims, 3 Drawing Figures

MODULATOR UTILIZING HIGH AND LOW FREQUENCY CARRIERS

BACKGROUND OF THE INVENTION

1. Field of the Invention

This invention relates to frequency translation of voice-frequency signals, and, in particular, to frequency translation in which the carrier leak is kept to a minimum without the use of band-stop filters.

2. Background Description

In communication circuits, and in particular, telephone communication circuits which employ frequency division multiplexing, it has always been important to use a minimum of bandwidth for each communication channel. This has most often been accomplished by use of the single-sideband modulation techniques in which a balanced modulator is employed, and the desired output sideband selected by a filter. Considerable effort has been made in the design of modulation circuits so as to reduce carrier-leak to a minimum, i.e., the carrier frequency which leaks through the modulator and is present along with the sidebands generated by the modulation process. While this problem is of considerable interest where standard 4 KHz channel spacing is employed, this interest stems primarily from a loading standpoint, because the passband frequencies for the channel are positioned such that the carrier leak does not adversely affect the communication channel. This is not the case in submarine cable systems which employ 3 KHz spacing because the carrier leak in the one channel here will cause an audible tone in another channel. For this reason the carrier leak must be maintained at a very low level (typically 1/30,000 of the signal level). Techniques for the design of channel equipment to operate in this restricted channel bandwidth are discussed in the following articles: "Sixteen-Channel Banks for Submarine Cables", R. S. Tucker, Bell Laboratories Record, July, 1960, pp. 248–252; and "Channel Equipment Design for Economy of Band-Width", H. B. Law, et al., The Post Office Electrical Engineers Journal, 53, Part II, (July, 1960), pp. 112–117. These articles disclose information on compatible systems which were designed for submarine cable applications in which a channel bandwidth of 3 KHz is employed. A band-stop filter was required to reduce the carrier leak to an acceptable level. A number of disadvantages are apparent from the use of the band-stop filter. Such things as cost and complexity, which add to the cost of the equipment and the adverse effect of the filter characteristic on the passband, which latter effect must be corrected by frequency attenuation equalizers, thus adding additional cost and complexity.

SUMMARY OF THE INVENTION

A voice-frequency translation circuit includes a modulation circuit responsive to a voice-frequency signal and to first and second carrier frequency signals to position the resultant sidebands in the desired frequency spectrum. The second carrier frequency is very much higher than the first. A means for selecting a desired sideband is provided.

DETAILED DESCRIPTION OF INVENTION

Figure 1:
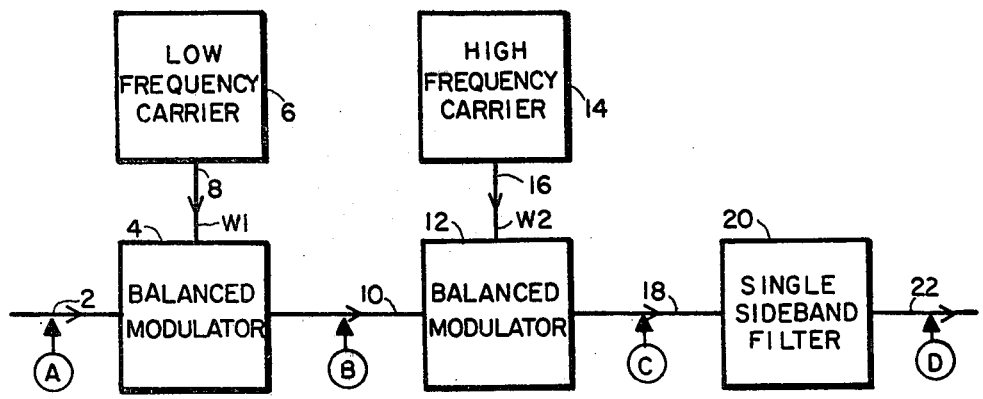
FIG. 1 is a block diagram of a preferred embodiment of the invention.
Figure 2:
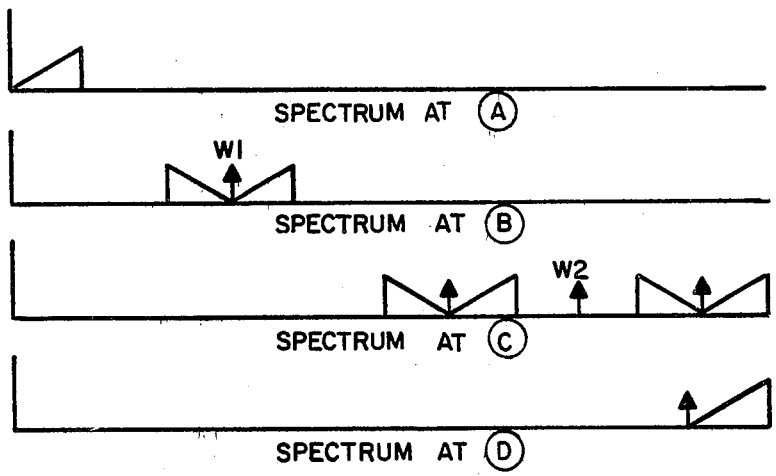
FIG. 2 is a frequency spectrum diagram showing the effect of the modulation process and the use of signal sideband filter 20 in deriving the line frequency single sideband signal.

Referring now to the drawing it may be seen that a voice frequency signal appearing on path 2 is applied to one input of balanced modulator 4 where it modulates the low frequency carrier signal from source 6 that is applied along path 8 to the balanced modulator 4 to produce a double sideband signal on path 10. The waveform spectra at various points in FIG. 1 are conventionally shown in FIG. 2. Note that a triangle is used to represent the voice-frequency and, as shown for spectrum A, the narrow part of the triangle represents the low frequencies, the width increasing for the higher frequencies. The spectrum B shown in FIG. 2 illustrates the double sideband with the lower one being inverted with respect to the original voice frequencies, as shown diagramatically by the left triangle, and the carrier of course appearing at the junction of the upper and lower sidebands. The spectrum at B is applied to the modulation input of the balanced modulator 12 where it modulates the high frequency carrier $\omega 2$ applied from the carrier source 14 via path 16. The spectrum which appears at the output of the balanced modulator 12 on path 18 is illustrated at C in FIG. 2. It should be noted that the high carrier frequency $\omega 2$ is now sufficiently separated from the upper and lower sidebands so as to be readily separated therefrom by an appropriate filtering mechanism. In the example shown, the separation is obtained by the use of single sideband filter 20 which in this case provides the upper sideband and the spectrum is shown at D in FIG. 2. It is apparent from the spectrum shown at D that the carrier leak, represented by the small arrow, which is a portion of the original carrier frequency, $\omega 1$ that is applied from the low frequency carrier source 6 via path 8 to balanced modulator 4, is the carrier leak which is present along with the single sideband signal on path 22. Thus, by employing a first stage of modulation at a sufficiently low frequency and with adequate care in the construction of the associated balanced modulator the carrier leak present in the line frequency spectrum will be such as to be tolerated in a submarine cable carrier system.

Figure 3:
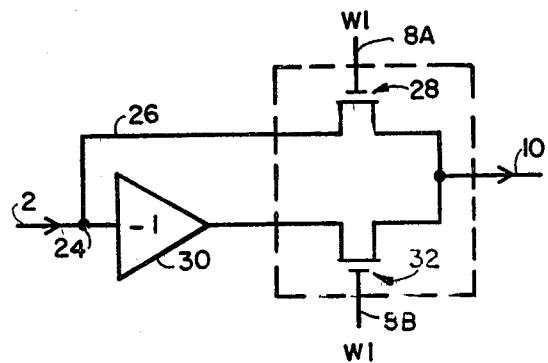
FIG. 3 is a block diagram of a balanced modulator that may be used as the circuit 4 in FIG. 1 to obtain a low amplitude of carrier leak.

Balanced modulators are well known, and a number of different configurations may be used at 4 or 12 in FIG. 1. But to obtain the desired low value of carrier leak, a modulator such as is shown in FIG. 3 is preferred. In this implementation of modulator 4, two CMOS field effect transistors are used as in the RCA CD 4053. Because the CMOS FET's have no offset voltage, such as is obtained from diodes or bipolar transistors, the carrier leak only arises from capacitive coupling, and this is low for the low frequency used for $\omega 1$. For example, the $\omega 1$ carrier would be at a frequency in the 20 KHz range. In contrast the $\omega 2$ carrier would be several orders of magnitude higher. In a practical device that was built and tested, the $\omega 2$ carrier was at a frequency in the 8 MHz range.

While the invention has been particularly shown and described with reference to a preferred embodiment thereof, it will be understood by those skilled in the art that changes in form and detail may be made therein without departing from the spirit and scope of the invention.

What is claimed is:

1. A low carrier-leak voice-frequency signal translation circuit which comprises:
 a source of low-frequency carrier signals;
 a source of high-frequency carrier signals in which the frequency is very high with respect to that of said low frequency signals;
 balanced modulation means responsive to signals from said low-frequency and said high-frequency sources for translating voice-frequency signals to a pre-determined plurality of positions in the frequency spectrum in an output signal thereof with substantially suppressed low frequency carrier; and,
 means for selecting a desired one of said frequency spectrum positions in said output signal.

2. A frequency translation circuit as in claim 1 wherein the ratio of the high to low carrier source frequencies is at least 50:1.

3. A frequency translation circuit as in claim 2, said balanced modulation means comprising first and second balanced modulators receiving associated low and high frequency carrier signals, and having the output of the first balanced modulator directly connected to an input of the second balanced modulator.

4. A frequency translation circuit as in claim 3,
 said first balanced modulator having as one input said voice-frequency signals, having as a second input said low-frequency carrier signal, and providing as an output signal upper and lower sidebands thereof generated by the modulation process, together with very low level leakage of the low-frequency carrier signal; and
 said second balanced modulator having as one input the output signal from said first balanced modulator, having as a second input the high-frequency carrier signal, and providing as an output signal upper and lower sidebands resulting from the modulation process and any leakage of the high-frequency carrier signal.

5. A frequency translation circuit as in claim 4, said means comprising a single sideband filter for selecting only the desired sideband in the output signal of said second balanced modulator.

* * * * *